United States Patent [19]

Matzek

[11] 3,768,027

[45] Oct. 23, 1973

[54] FM LIMITER USING SINGLE DIODE

[75] Inventor: Lester Tuvker Matzek, Chicago, Ill.

[73] Assignee: Warwick Electronics Inc., Chicago, Ill.

[22] Filed: Aug. 18, 1971

[21] Appl. No.: 172,762

[52] U.S. Cl. .................. 329/134, 307/233, 307/237, 328/171

[51] Int. Cl. .............................................. H03d 3/00

[58] Field of Search ................ 329/131, 134, 205 R, 329/203; 307/233, 237; 325/347, 348, 349, 482; 328/171

[56] References Cited

UNITED STATES PATENTS

| | | | |
|---|---|---|---|
| 3,036,224 | 5/1962 | Abraham | 328/171 X |
| 3,356,794 | 12/1967 | Felix | 329/134 X |
| 3,413,562 | 11/1968 | Hartin et al. | 307/237 X |
| 2,611,823 | 9/1952 | Weighton | 325/482 X |
| 3,373,366 | 3/1968 | Schulz | 329/131 |

*Primary Examiner*—Alfred L. Brody
*Attorney*—Hofgren, Wegner, Allen, Stellman & McCord

[57] ABSTRACT

A limiter circuit for an FM detector including a diode serially connected in the signal path between the FM signal source and the FM detector. A current source biases the diode into conduction. The limiter conducts low level FM signals without substantial alteration, suppresses low frequency signals, and limits the output when the input reaches a predetermined amplitude.

4 Claims, 8 Drawing Figures

INVENTOR.
LESTER TUCKER MATZEK
BY Hofgren, Wegner, Allen, Stellman & McCord
ATTORNEYS.

FM LIMITER USING SINGLE DIODE

In frequency modulation (FM), the transmitter carrier frequency is varied by an amount depending upon the modulating signal amplitude while the modulating signal frequency determines the rate at which the carrier frequency variation takes place. The amplitude of the FM signal is not involved in the actual process of transmitting intelligence and should be constant for the detector to function properly. Any variation in the amplitude of the FM signal distorts the intelligence transmitted. Consequently, the system can be made insensitive to amplitude modulation (AM) disturbances. This is a particularly desirable feature as atmospheric and man-made disturbances are largely AM.

commonly used FM limiter system which limits amplitude modulations in an FM signal requires a pair of diodes for clipping positive and negative portions of the signal and a high impedance semiconductor circuit having a constant current output. This invention utilizes a single diode and requires no active circuit elements.

SUMMARY OF THE INVENTION

A limiter circuit in an FM detection system utilizes a single diode connected in series in the signal path between a source of FM signal and a detector. A constant current bias source is connected to the diode rendering it conductive. The forward bias establishes a signal amplitude below which the diode is always conducting and above which the diode will be cut off for part of the cycle. A relatively constant amplitude signal is delivered from the limiter to the detector. The limiter circuit is relatively inexpensive to construct and does not require critical component tolerances.

DESCRIPTION OF THE PREFERRED EMBODIMENT

Figure 1:
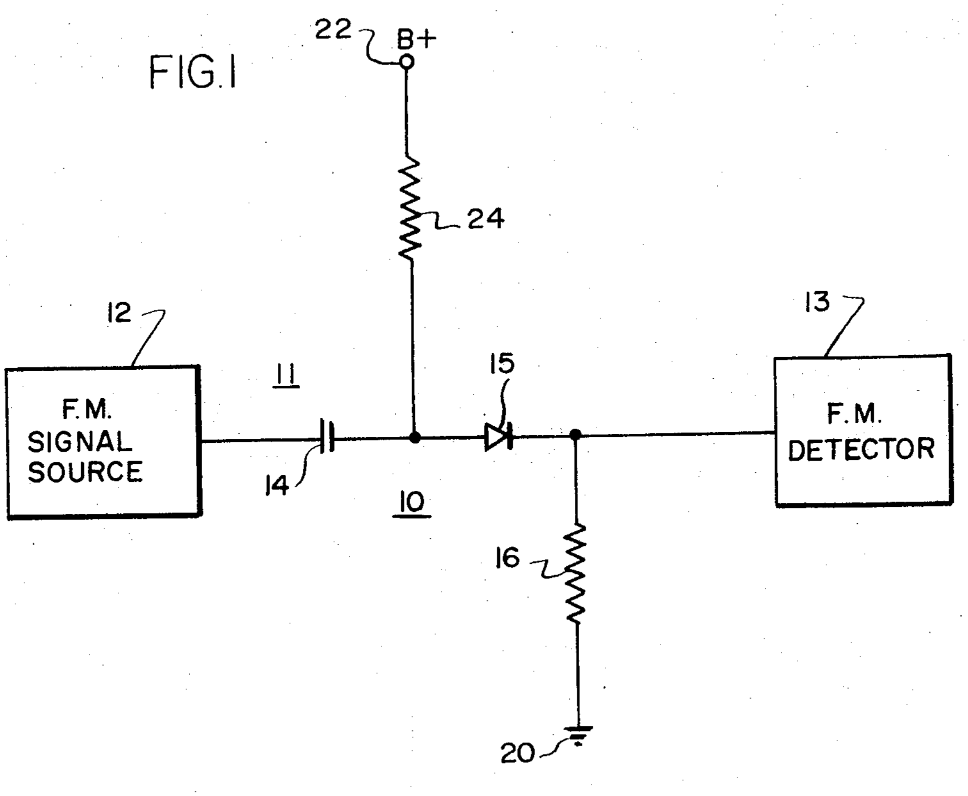
FIG. 1 is a schematic diagram of a circuit embodying the invention.

Referring now to FIG. 1, the limiter circuit 10 is connected in the signal path 11 between a source 12 of FM signals and an FM detector 13. Signal path 11 comprises an input blocking capacitor 14 serially connected to a diode 15. Resistor 16 represents the load impedance to signal voltages and is in shunt with the signal path 11 from the cathode of diode 15 to ground 20. Diode 15 is biased "on" from a constant current source comprised of a constant potential voltage source 22 serially connected through a resistor 24 that is large with respect to shunt connected load resistor 16.

Figure 2A:
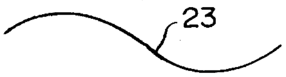
FIGS. 2A and 2B, 3A and 3B, and 4A and 4B are graphs of input voltage and diode current, respectively, with respect to time.
Figure 2B:
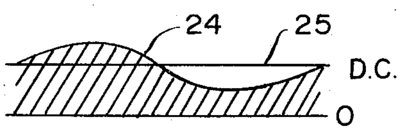
Figure 3A:
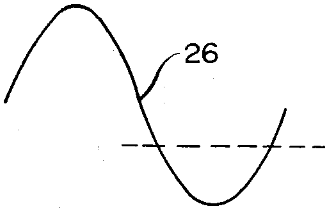
Figure 3B:
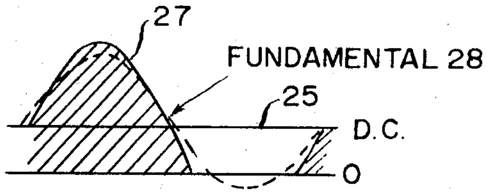
Figure 4A:
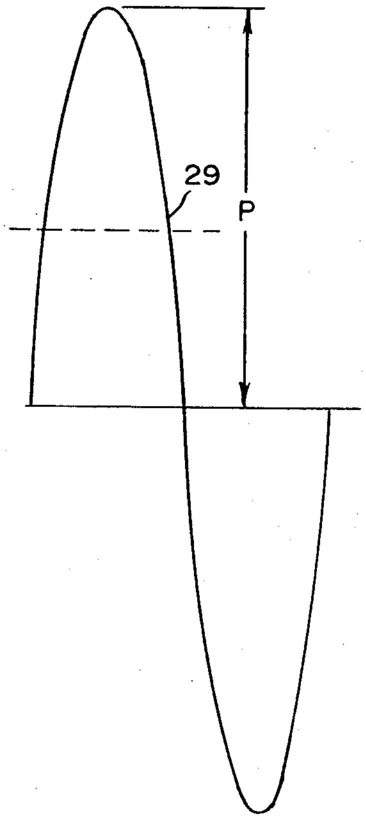
Figure 4B:
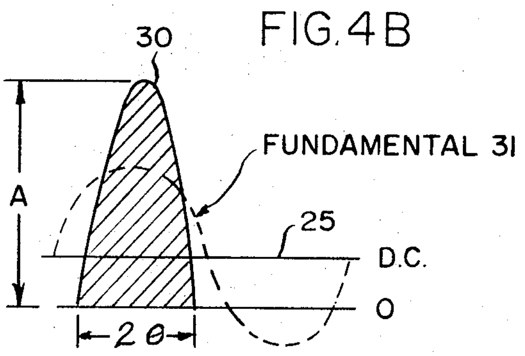

With reference to FIGS. 2 through 4, it can be seen that FM signals of an amplitude less than a predetermined level, i.e., the DC bias level 25, are conducted by the diode, developing a signal across the load 16 that is without substantial alteration from the FM input signal 23. In FIG. 2B, the average value or DC level of the curve 24 is represented by a shaded area under the curve. This average value, or DC level is represented by DC level 25 and, since the only directed current path through diode 15 is the constant current source comprising source 22, resistor 24 and load 16, it can be shown that this average or DC level is constant and equal to magnitude of the constant current source.

This average or direct current level of the signal passed by the diode also remains constant and equal to the constant current source magnitude when the peak amplitude thereof exceeds the level of the constant current source. This situation is illustrated in FIGS. 3 and 4. It should also be noted that the amplitude of the fundamental (wave forms 28 and 31) of the fractional since wave signal passed by the diode 15 remains relatively constant in comparison to the change in the input signal amplitude between input waves 26 and 29 shown in FIGS. 3A and 4A respectively. The average amplitude $A_{au}$, of the fundamental frequency of a fractional sine wave of the type produced by diode 15 in the embodiment of the invention shown in FIG. 1, is defined in the book "Reference Data for Engineers," Third Edition, published by the Federal Telephone and Radio Corporation, at page 303 as follows:

$$A_{av} -[A(\sin\theta - \cos\theta)/\pi \ (1 - \cos\theta)] \quad (1)$$

wherein A is the peak amplitude of the fractional sine wave and $2\theta$ is the width of the fractional sine wave at its base in radians.

For the purpose of simplification, if we let $Y = \sin\theta - \theta\cos\theta$ and $Z = \theta - \sin\theta\cos\theta$ then $$A_{av} = AY/\pi \ (1-\cos\theta) \quad (2)$$

In accordance with the teachings of the present invention $A_{av}$ is held constant by reason of the constant current source coupled to the diode 15 and therefore $$A_{av} = AY/\pi \ (1-\cos\theta) = 1, \quad (3)$$

$$A = \pi \ (1-\cos\theta)/Y$$

The amplitude of the fundamental of the fractional sine wave (C) is defined in the aforementioned reference as follows:

$$C = [(A_{av} \ \theta/Y) \ 1 -(\sin 2\theta/2\theta)] \quad (4)$$

With $A_{av}$ constant (assumed to be unity for simplification)

$$C = (\theta/Y)[1 - (\sin 2\theta/2\theta)] \quad (5)$$

Simplifying:

$$C = (\theta/Y)[1 -(\sin\theta\cos\theta/\theta)] = Z/Y \quad (6)$$

The peak amplitude of the input signal is related to the amplitude of the fractional sine wave and $\theta$ as follows:

$$P = A/(1-\cos\theta) = \pi/Y \qquad (7)$$

Figure 5:
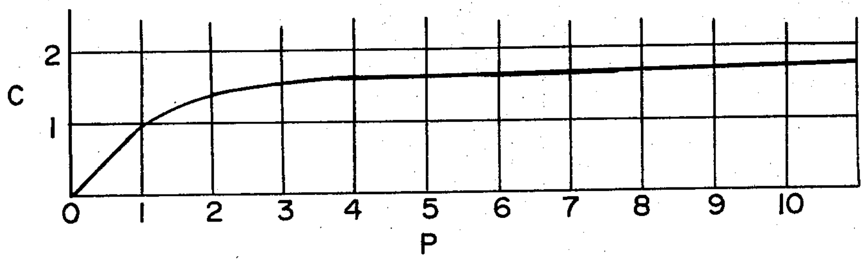
FIG. 5 is a graph which illustrates the limiting characteristics of the instant invention.

The graph shown in FIG. 5 is plot of values of P versus C, in arbitrary units, for given values of $\theta$. As can be seen from this graph as the peak amplitude (P) of the input signal exceeds 3 the magnitude of the fundamental approaches a maximum amplitude of approximately 2.

Thus it can be seen that current biased diode 15 of FIG. 1 functions as an effective amplitude limiter for values of peak input voltage above a given minimum level.

For proper operation of this circuit, the time constant when the diode is not conducting, i.e., capacitor 14 and resistor 24, must be short enough to follow any amplitude variations that are to be suppressed. This is necessary so that the diode current will be kept at a constant average and not changed by current from capacitor 14. Capacitor 14 and load resistor 16 form a voltage divider during conduction of the diode and capacitor 14 must be large enough not to present too large a loss in signal. Suitable component values would be:

Resistor 24 — 39,000 ohms
Capacitor 14 — 1,000 picofarads
Load 16 — 3,900 ohms

I claim:

1. An FM limiter for an FM detector, comprising:
- a source of FM signal subject to undesired posi-tive and negative polarity amplitude variations which exceed a minimum peak level,
- a diode connected in series between said FM source and said FM detector, and
- a constant current bias source connected to said diode for rendering it conductive when the amplitude variations are less than said minimum peak level and noncon-ductive during one polarity when the amplitude variations are greater than said minimum peak level to pass a fractional waveform having a fundamental with a magnitude which approaches a maximum amplitude.

2. The FM limiter of claim 1 wherein said bias source includes a constant potential supply serially connected through a bias resistor to the diode.

3. The FM limiter of claim 1 including a load connected in shunt with the series connection for providing a path for the bias current.

4. The FM limiter of claim 3 including a capacitor serially connected between the FM source and the diode and having a capacitive reactance at the frequency of the FM signal which is substantially less than the resistance of the load.

* * * * *